US010199344B2

(12) United States Patent
Suvanto

(10) Patent No.: US 10,199,344 B2
(45) Date of Patent: Feb. 5, 2019

(54) SIDE PORTED MEMS SENSOR DEVICE PACKAGE AND METHOD OF MANUFACTURING THEREOF

(71) Applicants: Akustica, Inc., Pittsburgh, PA (US); Robert Bosch GmbH, Stuttgart (DE)

(72) Inventor: Mikko V A Suvanto, Pittsburgh, PA (US)

(73) Assignees: Akustica, Inc., Pittsburgh, PA (US); Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/637,039

(22) Filed: Jun. 29, 2017

(65) Prior Publication Data

US 2018/0005969 A1    Jan. 4, 2018

Related U.S. Application Data

(60) Provisional application No. 62/356,958, filed on Jun. 30, 2016.

(51) Int. Cl.
*B81B 7/02* (2006.01)
*B81C 1/00* (2006.01)
*H01L 23/00* (2006.01)
*B81B 7/00* (2006.01)
*H01L 25/16* (2006.01)

(52) U.S. Cl.
CPC ............ *H01L 24/11* (2013.01); *B81B 7/0061* (2013.01); *B81B 7/02* (2013.01); *B81C 1/00301* (2013.01); *B81C 1/00309* (2013.01); *H01L 24/48* (2013.01); *H01L 25/165* (2013.01); *B81B 2201/0257* (2013.01);

(Continued)

(58) Field of Classification Search
CPC . B81B 7/0061; B81C 1/00309; H01L 25/165; H01L 2924/1461
See application file for complete search history.

(56) References Cited

U.S. PATENT DOCUMENTS

2004/0046245 A1  3/2004  Minervini
2008/0217709 A1  9/2008  Minervini et al.
(Continued)

FOREIGN PATENT DOCUMENTS

EP    1245528 A1    10/2002
EP    1992588 A2    11/2008
EP    2757808 A2    7/2014

OTHER PUBLICATIONS

International Search Report corresponding to International Patent Application PCT/EP2017/065658 (7 pages).

*Primary Examiner* — Daniel P Shook
(74) *Attorney, Agent, or Firm* — Maginot Moore & Beck LLP

(57) ABSTRACT

A MEMS sensor device package comprises a sensor assembly comprising a sensor device and a sensor circuit communicating coupled to the sensor device, The MEMS sensor device package further comprises an assembly package housing having a top member and a bottom member attached to the top member for encapsulating the sensor assembly. A passageway fluidly coupled the sensor device to attributes outside the package housing the passageway is embedded into the package housing, wherein the top member comprising a top wall and side walls, the side walls are attached to the bottom member, and the passageway is embedded into at least one of the side walls.

14 Claims, 11 Drawing Sheets

(52) U.S. Cl.
CPC . *B81B 2201/0264* (2013.01); *B81B 2207/012* (2013.01); *H01L 2924/1461* (2013.01)

(56) References Cited

U.S. PATENT DOCUMENTS

| | | | |
|---|---|---|---|
| 2008/0283988 A1* | 11/2008 | Huang | B81B 7/007 257/680 |
| 2013/0032905 A1 | 2/2013 | Lo et al. | |
| 2014/0001580 A1 | 1/2014 | Bolognia et al. | |

* cited by examiner

SIDE PORTED MEMS SENSOR DEVICE PACKAGE AND METHOD OF MANUFACTURING THEREOF

CROSS-REFERENCE TO RELATED APPLICATION

This application claims priority to a U.S. provisional patent application Ser. No. 62/356,958, filed Jun. 30, 2016, the contents of which are incorporated herein by reference as if fully enclosed herein.

FIELD

The disclosure generally relates to microelectromechanical system (MEMS) packages, and more particularly, to a MEMS sensor device package and method of manufacturing thereof.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure related to a side ported MEMS sensor device package. The package includes a sensor assembly comprising a sensor device and a sensor circuit communicating coupled to the sensor device. A package housing comprising a top member and a bottom member attached to the top member for encapsulating the sensor assembly. A passageway fluidly coupled the sensor device to attributes outside the package housing the passageway is embedded into the package housing wherein the top member comprising a top wall and side walls, the side walls are attached to the bottom member, and the passageway is embedded into at least one of the side walls.

BRIEF DESCRIPTION OF THE DRAWINGS

These and other features, aspects, and advantages of this disclosure will become better understood when the following detailed description of certain exemplary embodiments is read with reference to the accompanying drawings in which like characters represent like arts throughout the drawings, wherein.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

The disclosure is a MEMS sensor device package with a side opening or an offset passageway for at least one sensor device which encapsulated in a client machine. The client machine may be provided with other electronic components, such as sensor devices, speakers, graphical processor units, computer processor units, and any suitable computer implemented devices disposed either in the MEMS sensor device package or outside the MEMS sensor device package. The client machine may be a personal computer or desktop computer, a laptop, a cellular or smart phone, a tablet, a personal digital assistant (PDA), a gaming console, an audio device, a video device, an entertainment device such as a television, a vehicle infotainment, a wearable device, an entertainment or infotainment remote control, a thin client system, a thick client system, or the like.

The sensor device package includes a package housing or an enclosure for housing one or more sensor devices, internal components, or combination thereof. The sensor devices may be such as MEMS transducers, speakers, receivers, microphones, pressure sensors, thermal sensors, optical sensors, imaging sensors, chemical sensors, gyroscopes, inertial sensors, humidity sensors, accelerometers, gas sensors, environmental sensors, motion sensors, navigation sensors, vital sensors, tunnel magnetoresistive (TMR) sensors, proximity sensors, bolometers, or combination thereof. The microphones may be electret microphones, capacitive microphones, piezoelectric microphones, silicon microphones, optical microphones, or any suitable acoustic microphones.

Figure 1:
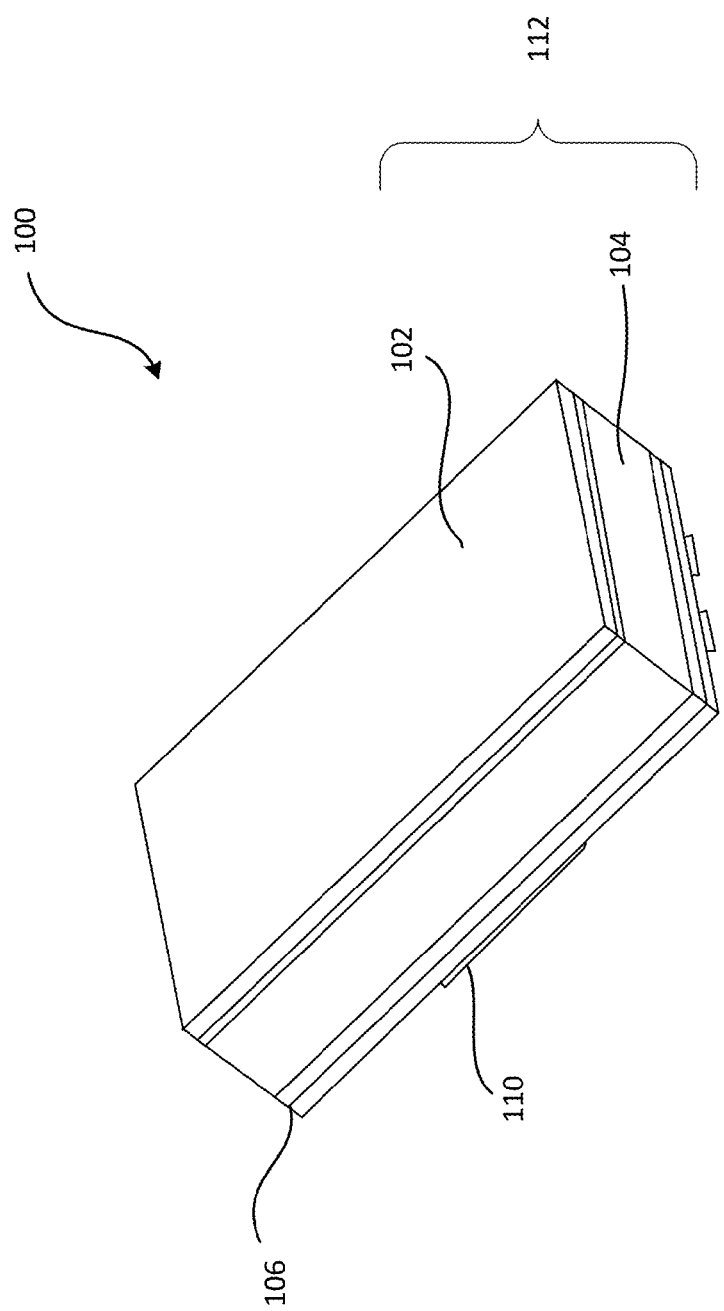
FIG. 1 is a perspective view of a MEMS sensor device package in accordance with embodiments of a disclosure.

FIG. 1 is a perspective of a MEMS sensor device package 100 according to an exemplary embodiment of the disclosure. The MEMS sensor device package 100 includes a package housing 112 having a lid 102, a spacer 104, and a substrate 106 attached to the spacer 104 by any suitable methods of attachment. More than one sensor device and/or internal component may be housed within the MEMS sensor device package 100. The sensor devices may be MEMS transducers, speakers, receivers, microphones, pressure sensors, thermal sensors, optical sensors, imaging sensors, chemical sensors, gyroscopes, humidity sensors, inertial sensors, vital sensors, TMR sensors, accelerometers, gas sensors, environmental sensors, motion sensors, navigation sensors, proximity sensors, bolometers, or combination thereof. The internal components may be integrated circuits, ASICs, processors, controllers, energy storage devices, sensor circuits, and any suitable components. Depending on the application, an opening such as a port or a passageway for receiving attributes from an environment which the package 100 is exposed may be formed on the sensor device package 100 by etching, drilling, punching, or any suitable methods. The attributes may be acoustic signal, pressure signal, optical signal, gas signal, and any suitable signal. The opening and the passageway will be described further in details below. Although the MEMS sensor device package 100 as depicted comprises a multi-structure package housing 112, various aspects and configurations either in a single structure package housing, a two piece structure package housing, or multi-structure package housing may be used to encapsulate at least one internal component. As an example, the lid 102 and the spacer 104 may be formed as a single structure, defines a cover or a cap. One or more bonding pads 110 may be formed on at least one of the substrate 106 or the cover by any suitable method for mounting the sensor device package 100 to an external printed circuit board or another support member of the client machine. In some embodiments, the package housing further includes an interposer coupled the cover 102 to either the spacer 104 or the substrate 106. The sensor circuit 114, the MEMS sensor device 116, or combination thereof disposed within the package housing 112 may be mounted to any of the cover 102, the spacer 104, the interposer, or the substrate 106 by any suitable method of attachments.

Figure 2:
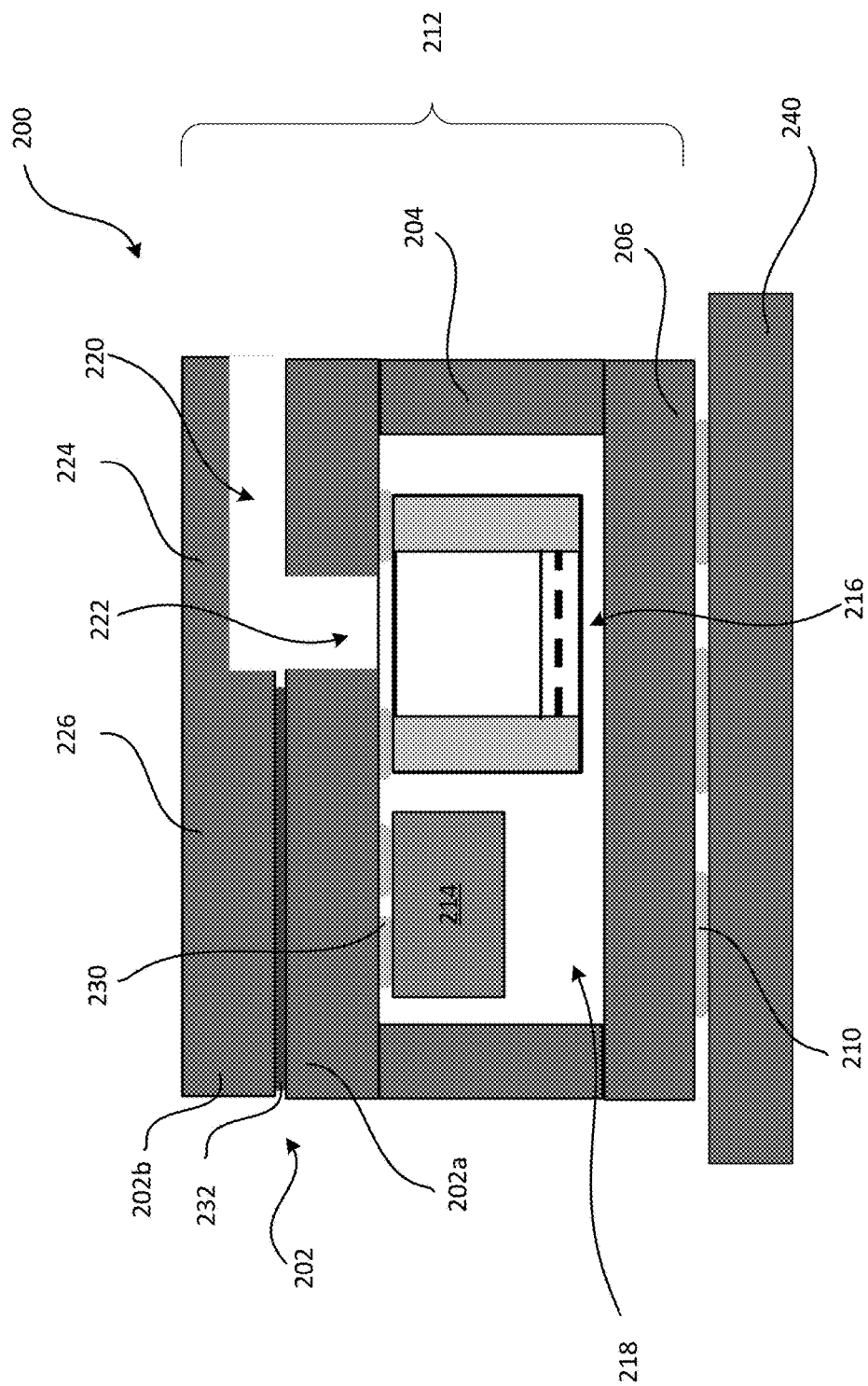
FIG. 2 is a cross-sectional view of an exemplary MEMS sensor device package in accordance with a described embodiment of the disclosure.

FIG. 2 is a cross-sectional view of an exemplary MEMS sensor device package 200 utilizing at least one sensor circuit 214 and a MEMS sensor device 216 in accordance with a described embodiment of the disclosure. The MEMS sensor device package 200 is similar to the MEMS sensor device package 100 depicted in FIG. 1. The MEMS device package 200 comprises a package housing 212 having a top member 202, a bottom member 206, and a spacer 204 coupled the top member 202 to the bottom member 206 by any suitable method of attachments. Disposed within the package housing 212 are the sensor circuit 214 and the MEMS sensor device 216 coupled to each other via either traces embedded within the package housing 212 or wire bonding. In some embodiments, more than one MEMS sensor device 216 coupled to the sensor circuit 214 may be disposed within the package housing 212. In another embodiments, more than one sensor circuit 214 coupled o the sensor circuit 214 may be disposed within the package housing. In yet embodiments, more than one MEMS sensor device 216 without the sensor circuit 214 may be disposed within the package housing. In further yet embodiment, the sensor circuit 214 and the MEMS sensor device 216 disposed within the package housing 212 may share a common cavity defined by the package housing 212. In another embodiment, a dividing wall is provided to divide the package housing 212 into two cavities, each of the sensor circuit 214 and the MEMS sensor device 216 are disposed in separate cavities. The package housing 212 further includes bonding pads 210 formed on the bottom member 206 by any suitable methods of attachment which in turn coupled the package housing 212 to an external assembly or circuitry 240 of a client machine. Signal generated by the sensor circuit 214 and the MEMS sensor device 216 is transmitted externally via traces and the bonding pad 210 to the external assembly or external circuitry 240. To mount the MEMS sensor device 216 and the sensor circuit 214 to the package housing 212, attachment or mounting elements 230 such as solder balls, bonding pads, or any suitable attachment elements are used. Although the sensor circuit 214 and the MEMS sensor device 216 as illustrated are mounted to the package housing 212 on a side-by-side configuration, other mounting configurations are possible, depending on the application. Other possible mounting configurations include back-to-back configuration, stacked configuration, etc. As an example, the MEMS sensor device 216 may be mounted either on top of the sensor circuit 214 or to the bottom of the sensor circuit 214, define a stacked configuration. As another example, the sensor circuit 214 includes a cavity and the MEMS sensor device 216 is disposed within the cavity and thereby is surrounded by the sensor circuit 214. Together, the sensor circuit 214 and the MEMS sensor device 216 are mounted to the same side of the wall of the package housing 212. As yet another example, the sensor circuit 214 and the MEMS sensor device 216 mounted within the package housing 212 may be mounted on different walls of the package housing 212 such that the sensor circuit 214 and the MEMS sensor device 216 are positioned opposite from each other which defined as back-to-back configuration. In some embodiments, instead of back-to-back configuration, the sensor circuit 214 and the MEMS sensor device 216 mounted to different walls of the package housing 212 are positioned in proximal relationship to each other.

As previously described, the sensor circuit 214 and the MEMS sensor device 216 may be mounted to any portion of the package housing 21, depending on the application. In one embodiment, the sensor circuit 214 is mounted to the top member 202 whereas the MEMS sensor device 216 is mounted to either the bottom member 206 or the spacer 204. In another embodiment, the sensor circuit 214 is mounted to the spacer 204 whereas the MEMS sensor device 216 is mounted to either the top member 202 or the bottom member 206. In yet further embodiment, any sensor circuit 214 and/or MEMS sensor device 216 may be mounted to either the bottom member 206 or the spacer 204 of the package housing 212, depending on the application. As illustrated, the sensor circuit 214 and the MEMS sensor device 216 are mounted to the top member 202 of the package housing 212. The top member 202 may be a lid or a cap and the bottom members 206 may be a substrate. As illustrated, the top member 202 is a lid and the bottom member 206 is a substrate. In some embodiment, the bottom member 206 may be an interposer. In yet another embodiment, the bottom member 206 may include a substrate with integrated interposer. Depending on the applications, more than one MEMS sensor device 216 and sensor circuit 214 may be encapsulated in the package housing 212.

The lid 202 of the package housing 212 includes a first layer 202*a* and a second layer 202*b* attached to the first layer 202*a* by any suitable attachment elements such as adhesive or solder 232. Other suitable attachment elements may be used to attach the layers 202*a*, 202*b* together. Although two layers 202*a*, 202*b* are illustrated, multiple layers formed from similar or different materials may be used to construct the lid 202. In another example, the package housing 212 includes a laminated lid 202 having two or more layers laminated together by any suitable attachment elements or methods. The layers 202*a*, 202*b* either attached or laminated together may be formed from materials such as metals, ceramics, alternating conductive and non-conductive materials, plastics, semiconductors, circuit boards such as FR4, brass, aluminum, or any suitable choice of materials. The lid 202 further includes a passageway 220 configured to allow attributes from an environment to enter the package housing 212. The attributes may be acoustic signal, thermal signal, pressure signal, optical signal, gas signal, and any suitable signal. The passageway 220 may be formed by etching, drilling, punching, or any suitable methods in a single or multiple lid fabrication processes. As illustrated, the passageway 220 is located above the MEMS sensor device 216. In some embodiments, the passageway 220 is located in proximal or adjacent to the MEMS sensor device 216 and yet allows attributes to enter and fluidly communicate with the MEMS sensor device 216. As an example, the passageway 220 includes an opening end or a port 222 formed on the first layer 202a by etching, drilling, punching, or any suitable methods. The second layer 202b includes a cutout portion 224 with a reduced thickness directly mounted on the port 222 to form the remaining part of the passageway 220. The second layer 202b further includes a second portion 226 having a thickness greater than the first or cutout portion that is attached to the first layer 202a using adhesive or solder 232, as an example. When the first and second layers 202a, 202b are attached together, a L-shape passageway 220 is formed. As illustrated in FIG. 2, the adhesive or solder 232 is applied to surfaces for attaching the first layer 202a to the second layers 202b. In some embodiments, the adhesive or solder 232 is applied to entire surfaces for attaching the first and second 202a, 202b together and then removes the adhesive or solder 232 by removing a portion of the attached first and second layers 202a, 202b for forming the passageway 220. The passageway 220 configured to allow attributes from an environment to enter the package housing 212 may be formed in any shape, geometry, or dimension. An optional environmental barrier may be provided within the passageway 220 to prevent debris and moisture to enter the package housing 212. The environmental barrier may be a mesh, a thin film with a plurality of perforated holes, or another suitable elements, depending on the applications.

Figure 3:
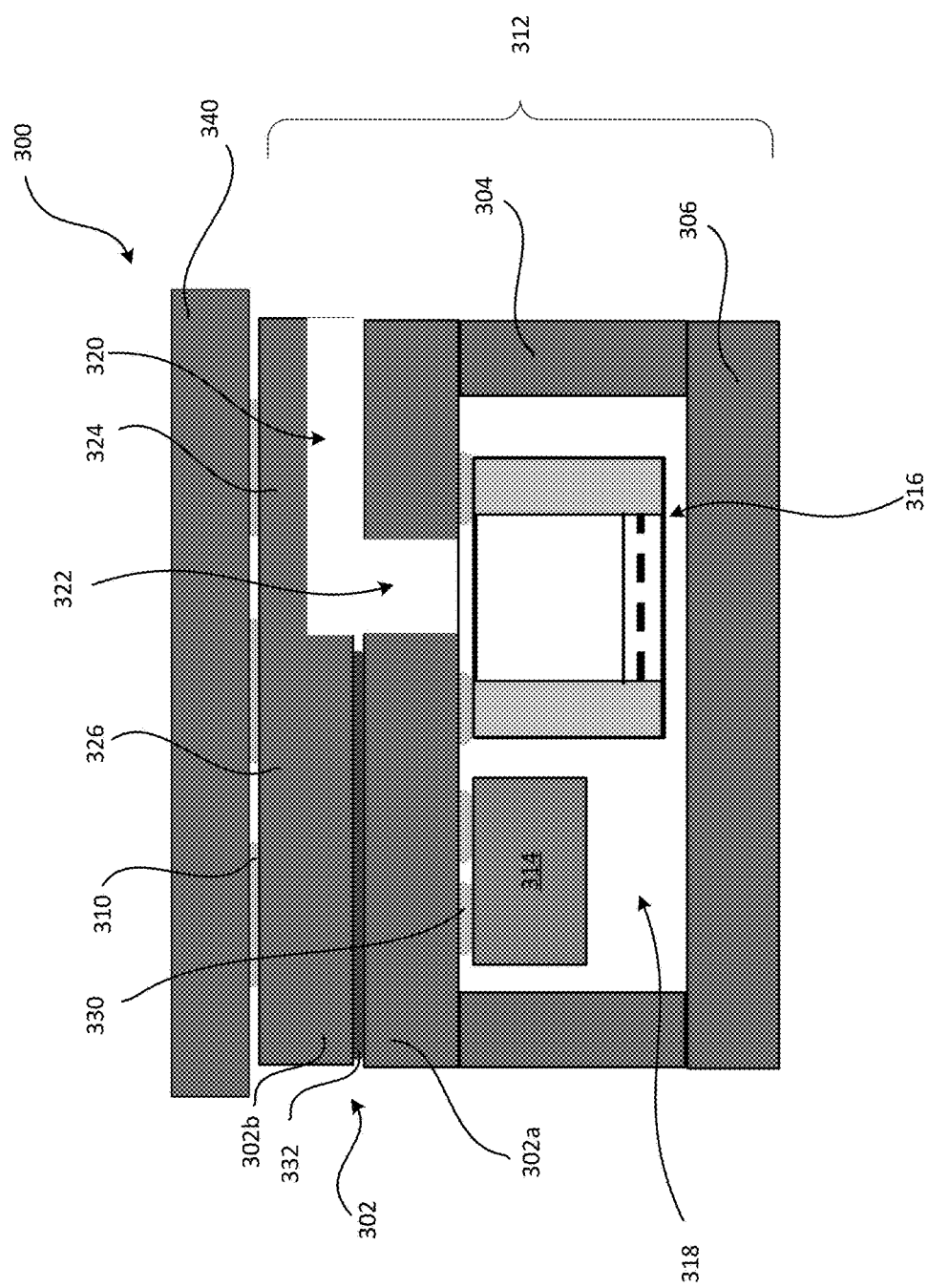
FIG. 3 is a cross-sectional view of an exemplary MEMS sensor device package in accordance with another described embodiment of the disclosure.

FIG. 3 is a cross-sectional view of an exemplary MEMS sensor device package 300 in accordance with another described embodiment of the disclosure. The MEMS sensor device package 300 is similar in construction to the MEMS sensor device package 200 illustrated in FIG. 2 except the external assembly or the circuit assembly 340 is located on top of the package housing 312 instead. The bonding pad 310 is formed on the top member 302 for mounting the external assembly or the circuit assembly 340 to the top member 302 of the package housing 312. As illustrated, the top member 302 is a lid.

Figure 4:
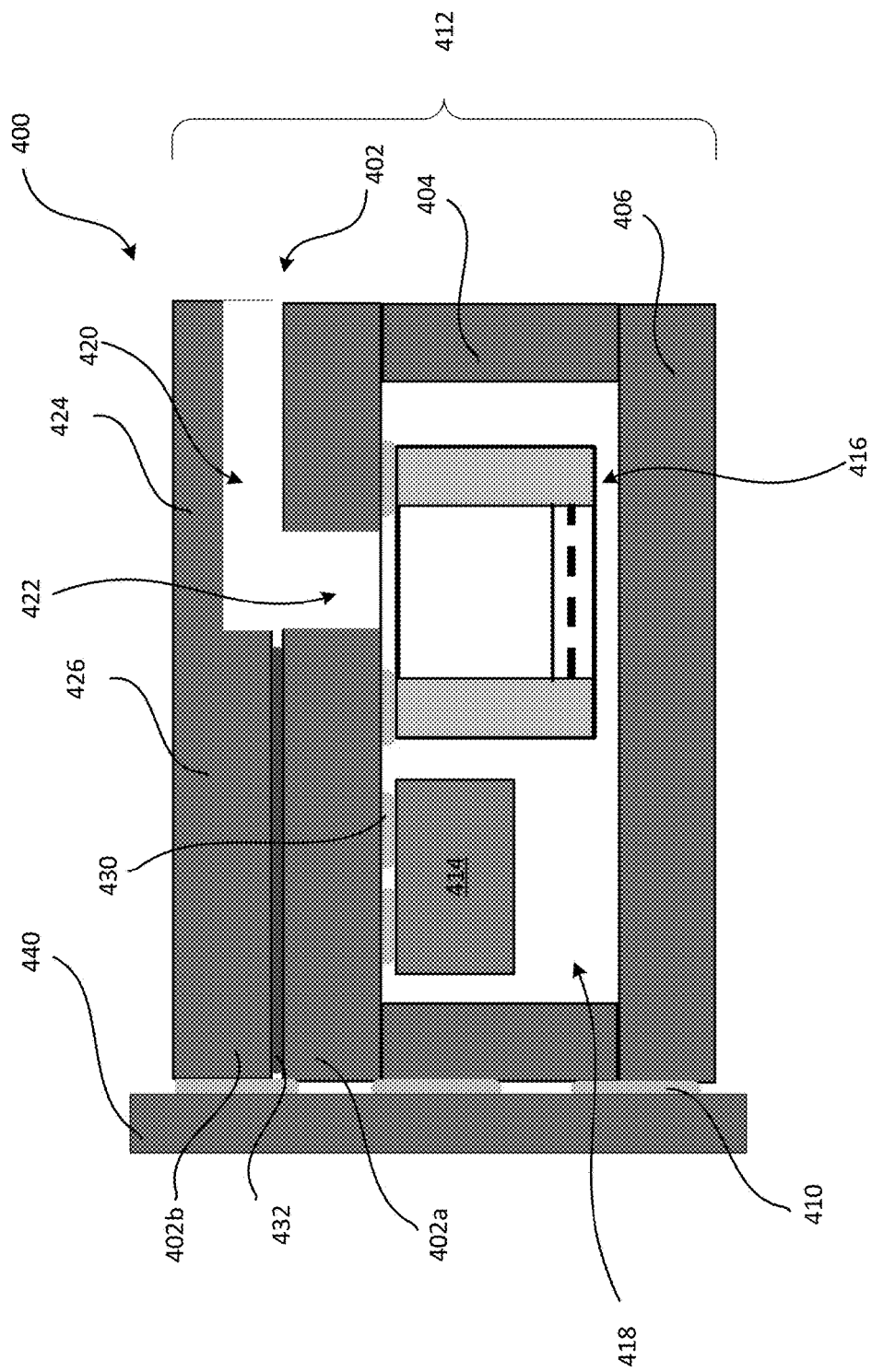
FIG. 4 is a cross-sectional view of an exemplary MEMS sensor device package in accordance with another described embodiment of the disclosure.

FIG. 4 is a cross-sectional view of an exemplary MEMS sensor device package 400 in accordance with another described embodiment of the disclosure. The MEMS sensor device package 400 is similar in construction to the MEMS sensor device package 300 illustrated in FIG. 3 except the external assembly or the circuit assembly 440 is located on one side of the package housing 312 and is opposite to the passageway 420 instead. The bonding pad 410 for mounting the external assembly or the circuit assembly 440 to the top member 402 of the package housing 412 is formed on side wall of at least one of the top member 402, the spacer 404, and the bottom member 406.

Figure 5:
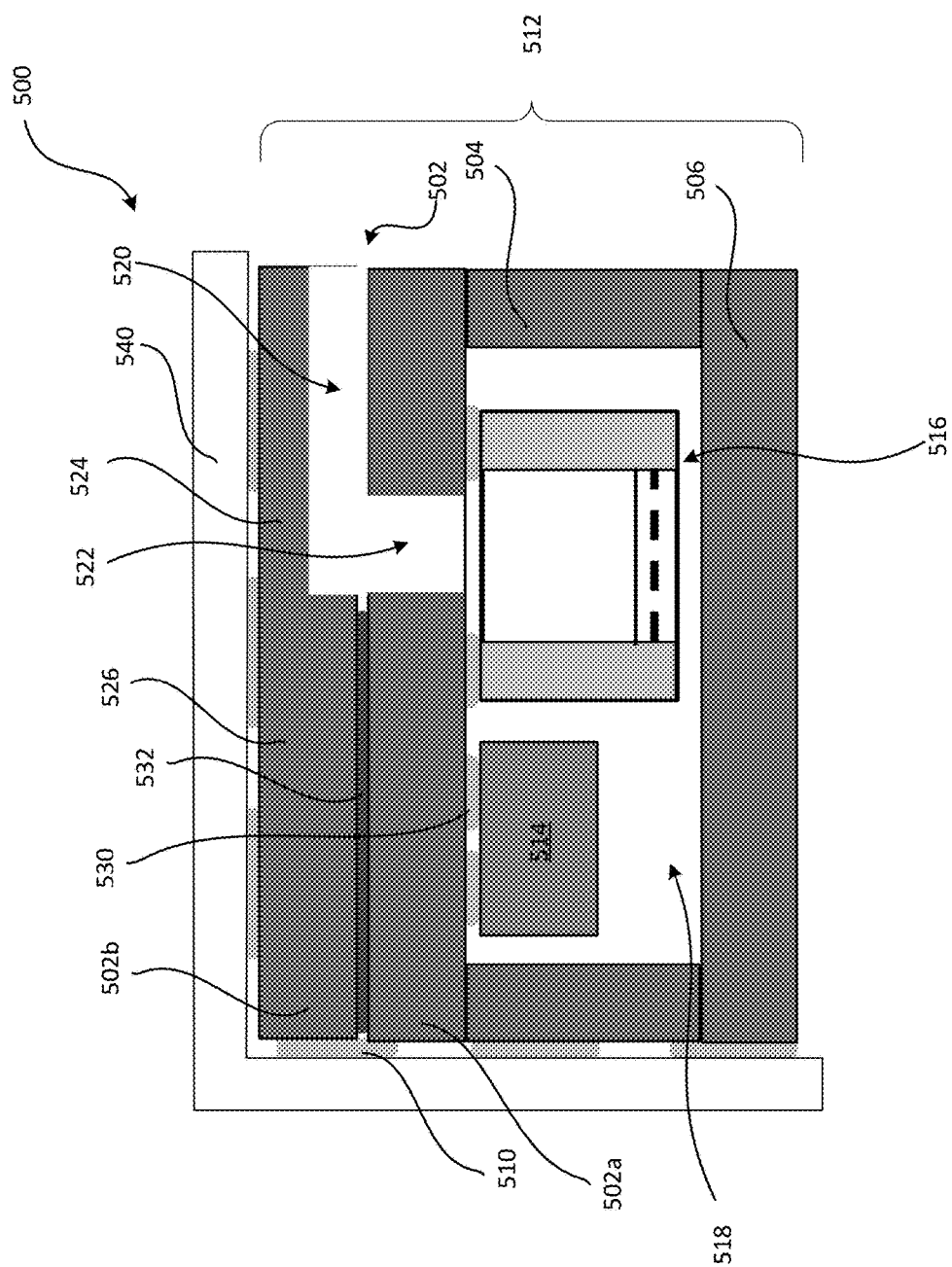
FIG. 5 is a cross-sectional view of an exemplary MEMS sensor dee/package in accordance with another described embodiment of the disclosure.

FIG. 5 is a cross-sectional view of an exemplary MEMS sensor device package 500 in accordance with another described embodiment of the disclosure. The MEMS sensor device package 500 is similar in construction to the MEMS sensor device package 400 illustrated in FIG. 4 except the external assembly or the circuit assembly 540 formed in a L-shape configuration is attached to and wrapped around the side and top surface of the package housing 512. The bonding pad 510 for mounting the external assembly or the circuit assembly 540 to the package housing 512 is formed on top and side walls of the package housing 512.

Figure 6:
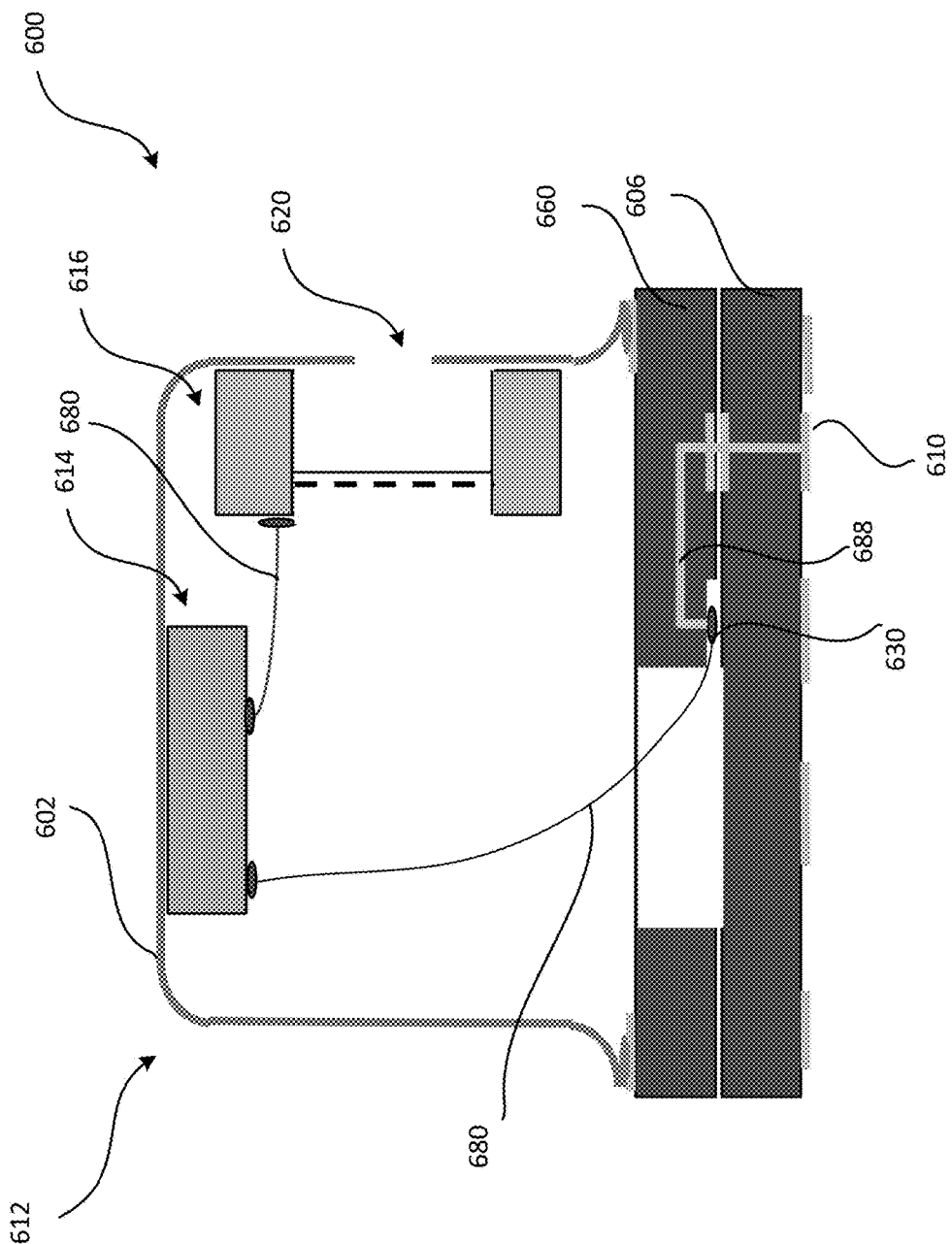
FIG. 6 is a cross-sectional view of an exemplary MEMS sensor device package in accordance with another described embodiment of the disclosure.

FIG. 6 is a cross-sectional view of an exemplary MEMS sensor device package 600 in accordance with another described embodiment of the disclosure. Unlike from the previous MEMS sensor device packages 100, 200, 300, 400, 500, the MEMS sensor device package 600 includes a package housing 612 having a top member 602, a bottom member 606, and an interposer 660 coupled between the top and bottom members 602, 606. As illustrated, the top member 602 is a cap and the sensor circuit 614 and the MEMS sensor device 616 are attached to the cap by any suitable method of attachments such as adhesive. In one example, the sensor circuit 614 is mounted adjacent to the MEMS sensor device 616. An input port or passageway 620 for receiving attributes to enter the package housing 612 is located adjacent or in proximal to the MEMS sensor device 616. The input port or passageway 620 in any shape and geometry, similar to the L-shaped passageway described previously for example, may be formed by etching, drilling, punching, or any suitable methods, depending on the application. The sensor circuit 614 and the MEMS sensor device 616 are coupled to each other via communicating link such as wire bonding 680. As illustrated in FIG. 6, one end of the wire bonding 680 is coupled to the sensor circuit 614 and the other end of the wire bonding 680 is coupled to traces 688 embedded in the bottom member 606 and the interposer 660 via an attachment element 230 such as solder balls, bonding pads, or any suitable elements. Signal or information such as data packet from the sensor circuit 614 and the MEMS sensor device 616 are transmitted or output to external circuit via bonding pads 610.

Figure 7:
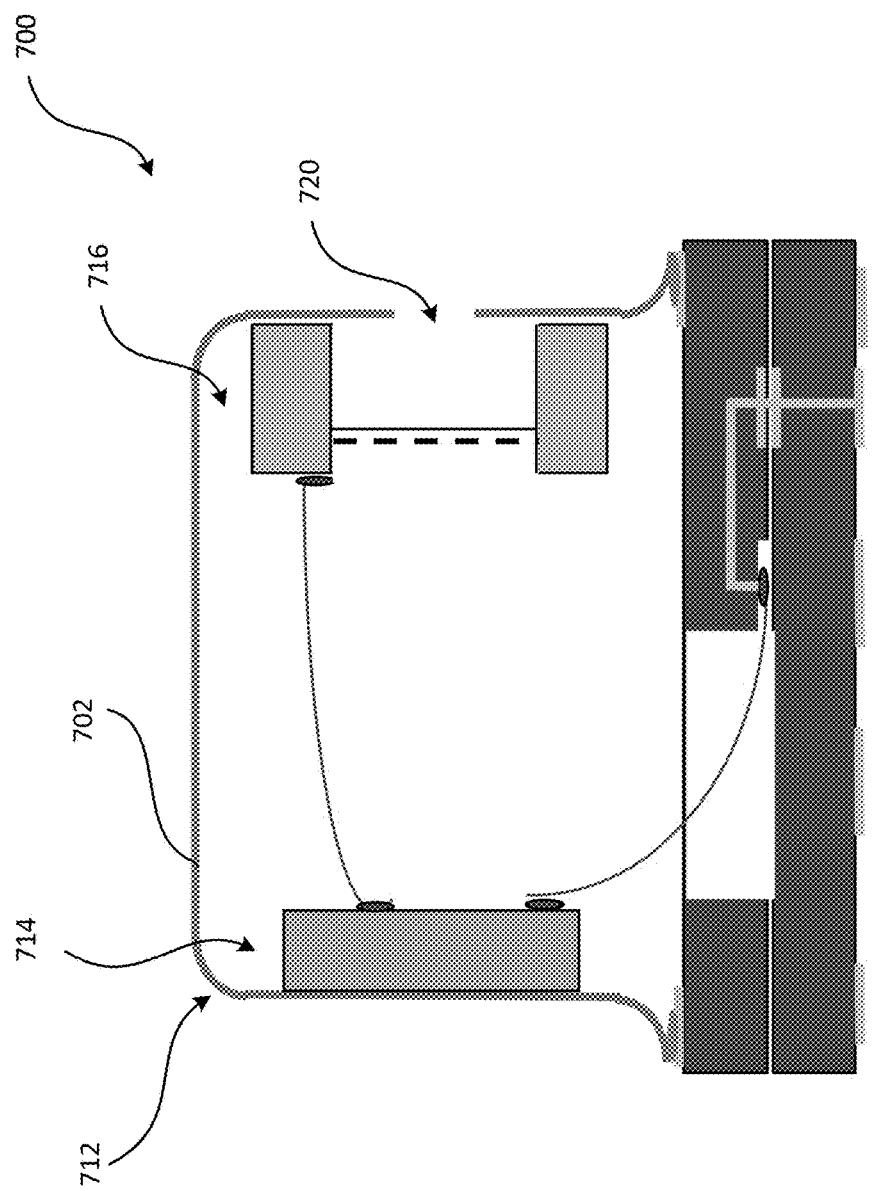
FIG. 7 is a cross-sectional view of an exemplary MEMS sensor device package in accordance with another described embodiment of the disclosure.

FIG. 7 is a cross-sectional view of an exemplary MEMS sensor device package 700 in accordance with another described embodiment of the disclosure. The MEMS sensor device package 700 is similar in construction to the MEMS sensor device package 600 illustrated in FIG. 6 except the sensor circuit 714 is mounted directly opposite to the MEMS sensor device 716. An input port or passageway 720 for receiving attributes to enter the package housing 712 is located adjacent or in proximal to the MEMS sensor device 716. The input port or passageway 720 in any shape and geometry, similar to the L-shaped passageway described previously for example, may be formed by etching, drilling, punching, or any suitable methods, depending on the application.

Figure 8:
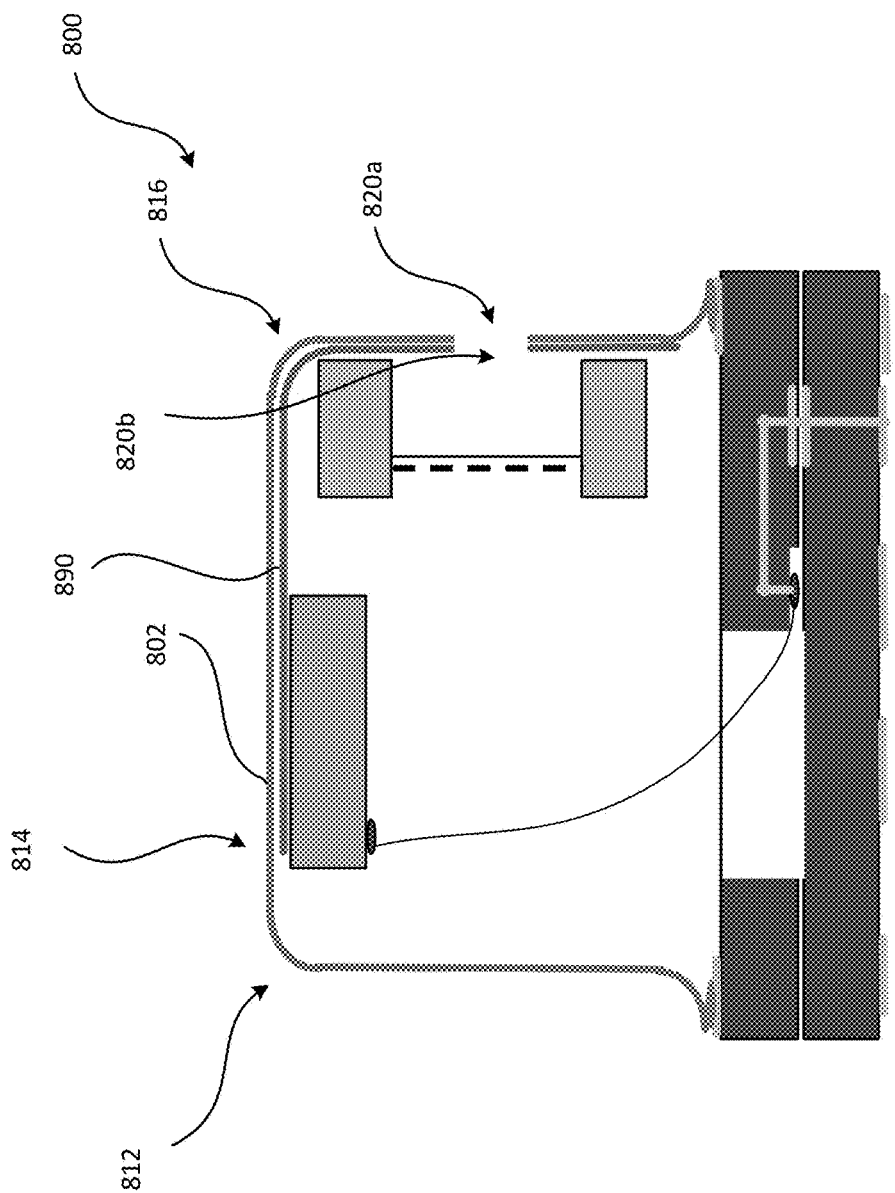
FIG. 8 is a cross-sectional view of an exemplary MEMS sensor device package in accordance with another described embodiment of the disclosure.

FIG. 8 is a cross-sectional view of an exemplary MEMS sensor device package 800 in accordance with another described embodiment of the disclosure. The MEMS sensor device package 800 is similar in construction to the MEMS sensor device package 600 illustrated in FIG. 6 except a flexible substrate 890 is provided and attached to the package housing 812, such as a lid 802 by any suitable method of attachment. Sensor circuit 814 and MEMS sensor device 816 are mounted or attached to the flexible substrate 890 which provides electrical connection between the sensor circuit 814 and the MEMS sensor device 816. The flexible substrate 890 may be a flexible circuit board. In some embodiment, the flexible substrate 890 is also bendable or foldable to conform the shape of the package housing 612 or the lid 102. To receive attributes to enter the package housing 812, input ports or passageways 820a, 820b are formed on the lid 802 and the flexible substrate 890. As depicted in FIG. 8, the input port 820a is aligned with the input port 820b. The dimension and geometry of the input ports 820a, 802b may be identical to each other. In some embodiments, the dimension of the input ports 820a, 80b, may be the same or different. In one example, the input port 820a has a dimension greater than the input port 820b. In yet another example, the input port 820a has a dimension smaller than the input port 820b.

Figure 9:
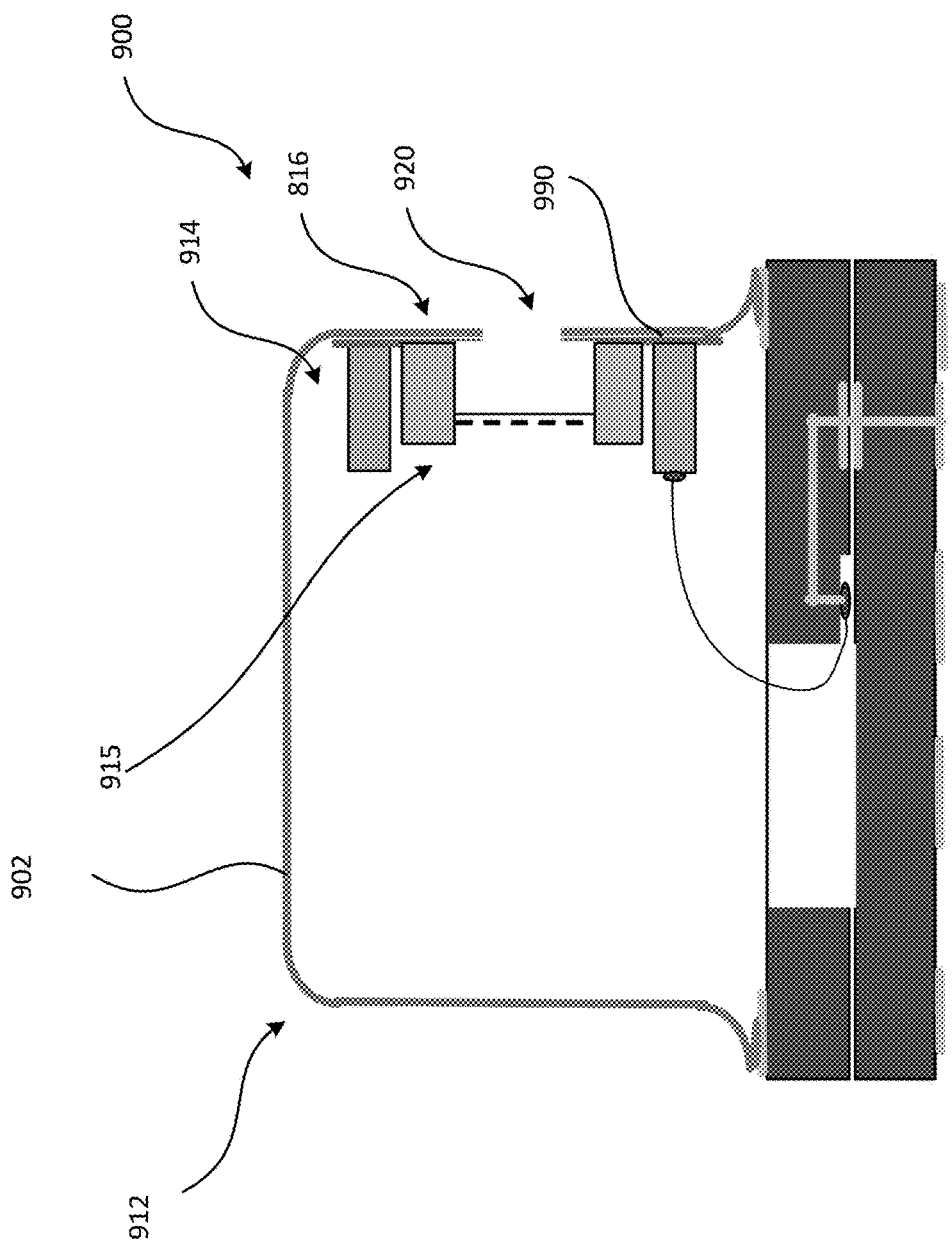
FIG. 9 is a cross-sectional view of an exemplary MEMS sensor device package in accordance with another described embodiment of the disclosure.

FIG. 9 is a cross-sectional view of an exemplary MEMS sensor device package 900 in accordance with another described embodiment of the disclosure. The MEMS sensor device package 900 is similar in construction to the MEMS sensor device package 800 illustrated in FIG. 8 except the sensor circuit 914 includes an opening 915 to accommodate the MEMS sensor device 916. As can be seen, the sensor circuit 914 formed as a surround and coupled to outer wall the MEMS sensor device 916. Disposed within the MEMS sensor device package 900 is a flexible substrate 990 and is attached to a lid 902 of the package housing 912. Input ports or passageways 920a, 920b are formed on the lid 902 and the flexible substrate 990 to receive attributes from external environment. The construction, geometry, and dimension of the input ports 920a, 920b are similar to the input ports 820a, 820b of FIG. 8.

Figure 10:
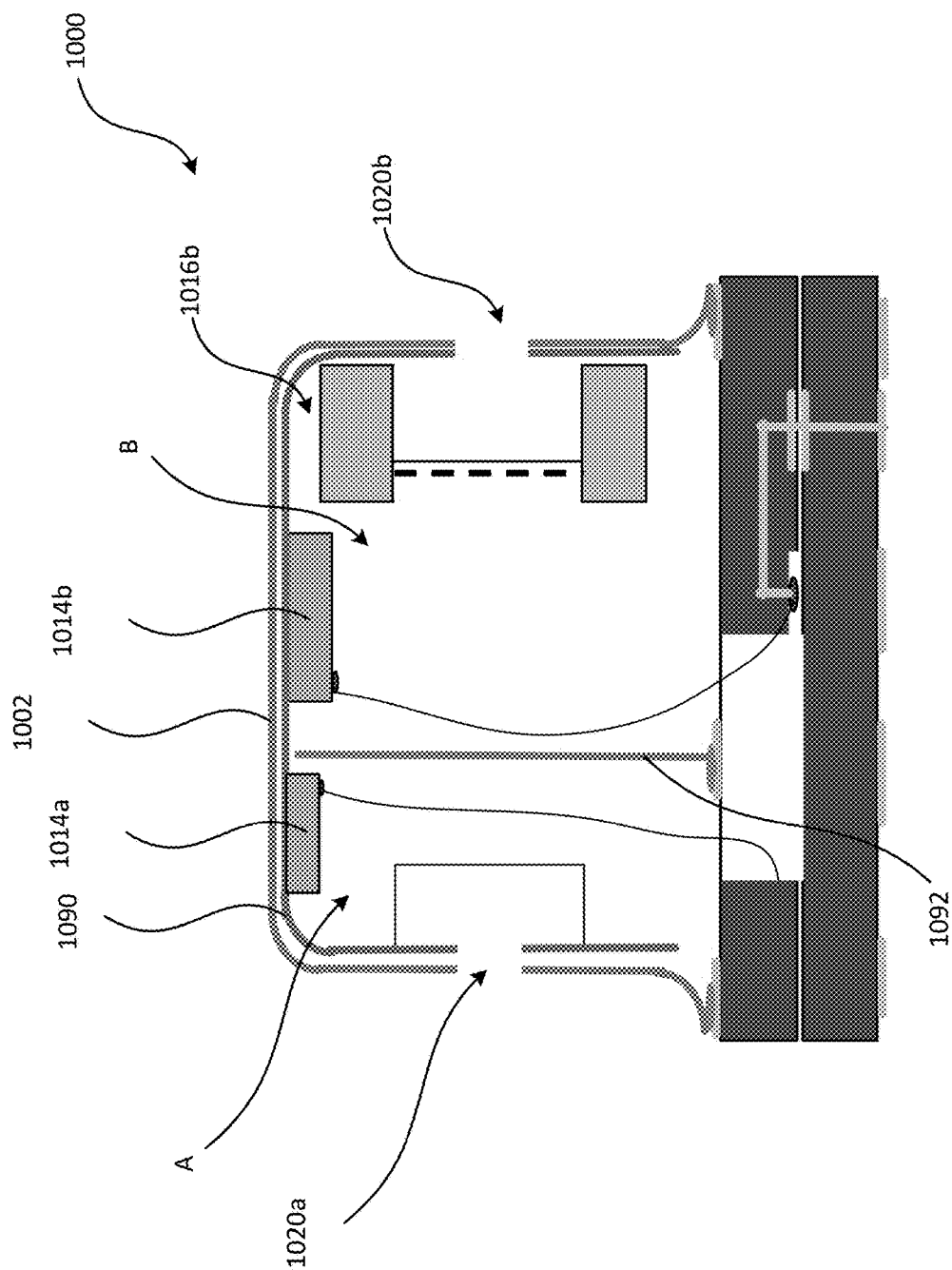
FIG. 10 is a cross-sectional view of an exemplary MEMS sensor device package in accordance with another described embodiment of the disclosure.

FIG. 10 is a cross-sectional view of an exemplary combo MEMS sensor device package 1000 in accordance with another described embodiment of the disclosure. Unlike from the previous MEMS sensor device package, a divider wall 1092 is provided within the package housing 1002 to form two cavities A, B. Different combination of sensor circuit and MEMS sensor device may be disposed within the cavities A, B. As an example, MEMS sensor device such as a MEMS microphone 1016b is mounted in the cavity B and a pressure sensor 1016b is mounted in the cavity A. In another example, MEMS sensor devices 1016a, 1016b are the same type of sensor devices. A flexible substrate 1090 conformed to the geometry of the lip 1002 is attached to the lip 1002. The flexible substrate 1090 provides electrical connection to one or more of the sensor circuit 1014a, 1014b and the MEMS sensor device 1016a, 1016b. Input ports or passageways 1020a, 1020b are formed on the lid 1002 and the flexible substrate 1090 to receive attributes from external environment into the package housing 1002. As illustrates, the input port 1020a is communicatively coupled with MEMS sensor device 916a whereas the input port 1020b is communicatively coupled with MEMS sensor device 916b. Any incoming attributes via the input ports 1020a, 1020b does not interfere with each other as the input ports 1020a and 1020b are separated by the divider wall 1092.

Figure 11:
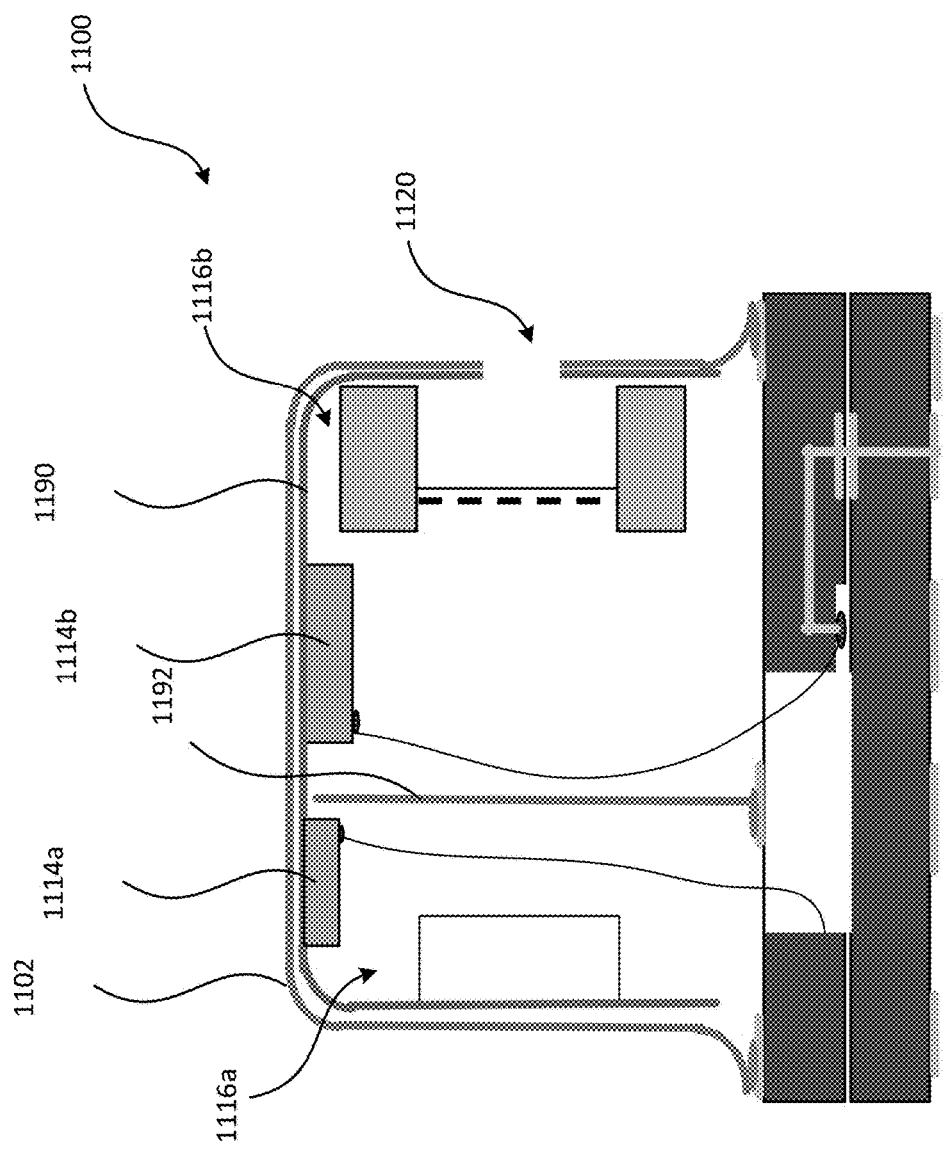
FIG. 11 is a cross-sectional view of an exemplary MEMS sensor device package in accordance with another described embodiment of the disclosure.

FIG. 11 is a cross-sectional view of an exemplary combo MEMS sensor device package 1100 in accordance with another described embodiment of the disclosure. Unlike from the previous MEMS sensor device package 1000, only one input port 1120 is provided to receive attributes from external environment. A divider wall 1192 is provided within the package housing 1102 to form two cavities A, B. As illustrated, MEMS sensor device 1116a and sensor circuit 1114a are hermetically sealed within the cavity A by the lid 1102 and the divider wall 1192 whereas the cavity B is fluidly communicated with the external environment via the input port 1120.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the sprit and scope of this disclosure.

While the patent has been described with reference to various embodiments, it will be understood that these embodiments are illustrative and that the scope of the disclosure is not limited to them. Many variations, modifications, additions, and improvements are possible. More generally, embodiments in accordance with the patent have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A MEMS sensor device assembly, comprising:
   a sensor assembly comprising a sensor device and a sensor circuit communicatively coupled to the sensor device;
   a package housing comprising a top member and a bottom member attached to the top member for encapsulating the sensor assembly; and
   a passageway fluidly coupling the sensor device to attributes outside the package housing, the passageway extending through the package housing,
   wherein the top member comprises a top wall and at least one side wall, the at least one side wall is attached to the bottom member, and the passageway extends through the at least one the side wall, and
   wherein the sensor device is mounted to the at least one side wall and the passageway is located proximal to the sensor device.

2. The MEMS sensor device of claim 1 wherein the sensor circuit is mounted to a flexible substrate and surrounds the sensor device.

3. The MEMS sensor device of claim 1 wherein the sensor circuit is mounted to the top wall.

4. A MEMS sensor device assembly, comprising:
   a sensor assembly comprising a sensor device and a sensor circuit communicatively coupled to the sensor device;
   a package housing comprising a top member located above a bottom member, the bottom member attached to the top member for encapsulating the sensor assembly; and
   a passageway fluidly coupling the sensor device to attributes outside the package housing, the passageway extending through the package housing,
   wherein the top member comprises a top wall and at least one side wall, the at least one side wall is attached to the bottom member, and the passageway extends through the at least one the side wall, and
   wherein the sensor device is mounted to the top wall and the passageway is located at least in part directly above the sensor device.

5. The MEMS sensor device of claim 4 wherein the sensor circuit is mounted to the top wall.

6. A MEMS sensor device assembly, comprising
   a first sensor assembly comprising a sensor device and a sensor circuit communicatively coupled to the sensor device;
   a package housing comprising a top member and a bottom member attached to the top member for encapsulating the sensor assembly;

a passageway fluidly coupling the sensor device to attributes outside the package housing, the passageway extending through the package housing, wherein the top member comprises a top wall and at least one side wall, the at least one side wall is attached to the bottom member, the passageway extends through the at least one the side wall, and the first sensor assembly is attached to a first of the at least one side wall; and a second sensor assembly and the second sensor assembly is mounted to a second of the at least one side wall opposite from the first sensor assembly.

7. The MEMS sensor device of claim 6 further comprising a second passageway located proximal to the second sensor assembly.

8. The MEMS sensor device of claim 6 further comprising a divider separating the first and second sensor assemblies.

9. The MEMS sensor device of claim 8 wherein the second sensor assembly comprises a second sensor device.

10. The MEMS sensor device of claim 9 wherein the second sensor device is selected from a group consisting of MEMS transducers, speakers, receivers, microphones, pressure sensors, thermal sensors, optical sensors, imaging sensors, chemical sensors, gyroscopes, inertial sensors, humidity sensors, accelerometers, gas sensors, environmental sensors, motion sensors, navigation sensors, vital sensors, tunnel magnetoresistive (TMR) sensors, proximity sensors, bolometers, or combination thereof.

11. The MEMS sensor device of claim 9 further comprising a conductive film and the top member is covered by the conductive film.

12. The MEMS sensor device of claim 11 wherein the first and second sensor assemblies are mounted to the conductive film.

13. The MEMS sensor device of claim 12 wherein a portion of the top member is covered by the conductive film for which to mount the first and second sensor assemblies to the top member.

14. The MEMS sensor device claim 13 wherein the conductive firm is formed on at least one of the top wall and the side walls.

* * * * *